US010854941B2

(12) United States Patent
Larsen et al.

(10) Patent No.: US 10,854,941 B2
(45) Date of Patent: Dec. 1, 2020

(54) BROADBAND WAVEGUIDE

(71) Applicant: Etegent Technologies LTD., Cincinnati, OH (US)

(72) Inventors: Christopher G. Larsen, Cincinnati, OH (US); Oleg Lobkis, Mason, OH (US); Richard A. Roth, Goshen, OH (US); Stuart J. Shelley, Cincinnati, OH (US); Conor Coyan, Stanford, CA (US); Jason Feldman, Cincinnati, OH (US); Ann El Demery, Lebanon, OH (US); Mackenzie Shelley, Ann Arbor, MI (US)

(73) Assignee: ETEGENT TECHNOLOGIES, LTD., Cincinnati, OH (US)

( * ) Notice: Subject to any disclaimer, the term of this patent is extended or adjusted under 35 U.S.C. 154(b) by 0 days.

(21) Appl. No.: 16/237,397

(22) Filed: Dec. 31, 2018

(65) Prior Publication Data
US 2019/0157733 A1 May 23, 2019

Related U.S. Application Data

(62) Division of application No. 15/033,350, filed as application No. PCT/US2014/063463 on Oct. 31, 2014, now abandoned.
(Continued)

(51) Int. Cl.
*H01P 3/10* (2006.01)
*H01P 11/00* (2006.01)
(Continued)

(52) U.S. Cl.
CPC .............. *H01P 3/10* (2013.01); *H01L 41/257* (2013.01); *H01P 3/04* (2013.01); *H01P 11/001* (2013.01); *H01Q 13/02* (2013.01)

(58) Field of Classification Search
CPC ..................................... H01P 3/06; H01P 3/10
See application file for complete search history.

(56) References Cited

U.S. PATENT DOCUMENTS

| 801,130 A | 10/1905 | Barclay | |
|---|---|---|---|
| 2,786,981 A * | 3/1957 | Zaleski | H01P 5/103 333/33 |

(Continued)

FOREIGN PATENT DOCUMENTS

| DE | 2521411 A1 | 11/1976 |
|---|---|---|
| DE | 102005011402 A1 | 9/2006 |

(Continued)

OTHER PUBLICATIONS

Written Opinion of the International Searching Authority for PCT/US2012/043766, dated Nov. 21, 2012. (13WO).
(Continued)

*Primary Examiner* — Dean O Takaoka
*Assistant Examiner* — Alan Wong
(74) *Attorney, Agent, or Firm* — Middleton Reutlinger

(57) ABSTRACT

A broadband waveguide comprising at least one filament configured to transmit a signal therethrough. The broadband waveguide may include one or more reflection suppression techniques including a damping material coupled to at least a portion of the at least one filament and/or at least one reflection point configured thereon. The waveguide may further including a cladding material coupled to the at least one filament. The at least one filament may be coupled to a securing element configured to couple to a surface. The at least one filament may be coupled to a sensor configured to sense the transmitted signal.

18 Claims, 9 Drawing Sheets

Related U.S. Application Data

(60) Provisional application No. 61/898,788, filed on Nov. 1, 2013.

(51) Int. Cl.
    *H01L 41/257* (2013.01)
    *H01P 3/04* (2006.01)
    *H01Q 13/02* (2006.01)

(56) References Cited

U.S. PATENT DOCUMENTS

| | | |
|---|---|---|
| 2,968,943 A | 1/1961 | Statham |
| 3,071,974 A | 1/1963 | Peterson |
| 3,079,800 A | 3/1963 | Brooks |
| 3,201,735 A | 8/1965 | Brown et al. |
| 3,584,327 A | 6/1971 | Murry et al. |
| 3,915,018 A | 10/1975 | Karplus |
| 3,940,637 A * | 2/1976 | Ohigashi ............... H03K 17/964 310/339 |
| 4,149,422 A | 4/1979 | Olsen et al. |
| 4,165,651 A | 8/1979 | Olsen et al. |
| 4,165,652 A | 8/1979 | Olsen et al. |
| 4,336,719 A | 6/1982 | Lynnworth |
| 4,414,652 A | 11/1983 | Crist |
| 4,452,334 A | 6/1984 | Rogers |
| 4,499,438 A | 2/1985 | Cornelius et al. |
| 4,603,942 A | 8/1986 | Chang et al. |
| 4,610,551 A | 9/1986 | Shah |
| 4,663,965 A | 5/1987 | Metcalf et al. |
| 4,667,097 A | 5/1987 | Fasching et al. |
| 4,676,663 A | 6/1987 | Tehon |
| 4,743,752 A | 5/1988 | Olsen et al. |
| 4,743,870 A | 5/1988 | Jen et al. |
| 4,783,997 A | 11/1988 | Lynnworth |
| 4,800,316 A | 1/1989 | Ju-Zhen |
| 4,823,600 A | 4/1989 | Biegel et al. |
| 4,939,457 A | 7/1990 | Tellerman |
| 5,003,825 A | 4/1991 | Lew |
| 5,022,014 A | 6/1991 | Kulczyk et al. |
| 5,044,769 A | 9/1991 | Kulczyk et al. |
| 5,159,838 A | 11/1992 | Lynnworth |
| 5,545,984 A * | 8/1996 | Gloden ................ G01B 17/00 324/207.13 |
| 5,670,720 A | 9/1997 | Clark et al. |
| 5,713,916 A | 2/1998 | Dias |
| 5,821,430 A | 10/1998 | Kwun et al. |
| 5,821,743 A | 10/1998 | Page et al. |
| 5,897,569 A | 4/1999 | Kellogg et al. |
| 5,962,790 A | 10/1999 | Lynnworth et al. |
| 6,047,602 A | 4/2000 | Lynnworth |
| 6,081,638 A | 6/2000 | Zhou |
| 6,185,155 B1 * | 2/2001 | Steinich ................ G01B 17/00 367/140 |
| 6,232,769 B1 | 5/2001 | Brunsch et al. |
| 6,281,976 B1 | 8/2001 | Taylor et al. |
| 6,343,511 B1 | 2/2002 | Lynnworth et al. |
| 6,413,103 B1 | 7/2002 | Merz et al. |
| 6,889,552 B2 | 5/2005 | Nguyen et al. |
| 6,912,907 B2 | 7/2005 | Fujimoto |
| 6,919,779 B2 | 7/2005 | Raphalovitz et al. |
| 6,975,179 B2 | 12/2005 | Harris |
| 7,016,047 B2 | 3/2006 | May |
| 7,017,415 B2 | 3/2006 | Harrold et al. |
| 7,162,925 B2 | 1/2007 | Dietrich |
| 7,258,014 B2 | 8/2007 | Rudkin |
| 7,414,410 B2 | 8/2008 | Pharn et al. |
| 7,454,978 B2 | 11/2008 | Schroeder et al. |
| 7,952,360 B2 | 5/2011 | Ganesh |
| 8,297,835 B2 | 10/2012 | Girbig et al. |
| 8,390,402 B2 * | 3/2013 | Kunes .................... H01P 3/14 333/241 |
| 9,048,521 B2 | 6/2015 | Larsen et al. |
| 9,182,306 B2 | 11/2015 | Roth, II et al. |
| 9,472,840 B2 * | 10/2016 | Herbsommer .......... H01P 3/122 |
| 10,352,778 B2 | 7/2019 | Larsen et al. |
| 2002/0130253 A1 | 9/2002 | Yashiro et al. |
| 2003/0056595 A1 | 3/2003 | Harrold et al. |
| 2004/0119552 A1 | 6/2004 | Wray |
| 2005/0012431 A1 | 1/2005 | Andle |
| 2005/0144955 A1 | 7/2005 | Handelsman et al. |
| 2005/0238301 A1 | 10/2005 | Russell et al. |
| 2006/0290356 A1 | 12/2006 | Pharn et al. |
| 2008/0090023 A1 | 4/2008 | Nayar et al. |
| 2008/0232197 A1 | 9/2008 | Kojima et al. |
| 2008/0307885 A1 | 12/2008 | Ravitch et al. |
| 2009/0038904 A1 * | 2/2009 | Bosk ..................... F16D 7/028 192/56.1 |
| 2009/0314088 A1 | 12/2009 | Djordjevic et al. |
| 2011/0314919 A1 | 12/2011 | Ehlert |
| 2012/0242426 A1 * | 9/2012 | Larsen ............... G01N 29/2462 333/239 |
| 2012/0266676 A1 | 10/2012 | Mueller et al. |
| 2012/0325018 A1 | 12/2012 | Roth, II et al. |
| 2014/0144156 A1 | 5/2014 | Lang et al. |
| 2015/0175095 A1 * | 6/2015 | Inao .................... B60R 16/0207 174/72 C |
| 2015/0377836 A1 | 12/2015 | Lanza et al. |
| 2016/0273973 A1 | 9/2016 | Larsen et al. |
| 2016/0294033 A1 | 10/2016 | Larsen et al. |
| 2017/0030871 A1 | 2/2017 | Lobkis et al. |

FOREIGN PATENT DOCUMENTS

| | | | |
|---|---|---|---|
| DE | 102007062864 A1 * | 6/2009 | ............. G01D 11/10 |
| DE | 102007062864 A1 | 6/2009 | |
| EP | 0053036 A1 | 6/1982 | |
| EP | 0467818 A1 | 1/1992 | |
| EP | 1014525 A1 | 6/2000 | |
| EP | 1238715 A1 | 9/2002 | |
| EP | 1566815 A2 | 8/2005 | |
| EP | 2194325 A1 | 6/2010 | |
| GB | 2114297 A | 8/1983 | |
| JP | 61061027 A | 3/1986 | |
| WO | WO2001035133 A1 | 5/2001 | |
| WO | WO2007136040 A1 | 11/2007 | |
| WO | WO 2013053699 | 4/2013 | |
| WO | WO2015066494 A2 | 5/2015 | |
| WO | WO2015099884 A2 | 7/2015 | |
| WO | WO2016016631 A1 | 2/2016 | |
| WO | WO2016162880 A1 | 10/2016 | |
| WO | WO2015157488 A1 | 2/2017 | |
| WO | WO2018191290 A1 | 10/2018 | |
| WO | WO 2018226310 A2 | 12/2018 | |
| WO | WO2019018021 A2 | 1/2019 | |

OTHER PUBLICATIONS

International Search Report and Written Opinion of PCT Ser. No. PCT/US14/63463, dated Mar. 26, 2015. (18WO).

International Search Report and the Written Opinion for PCT/US2014/63409, dated Jun. 24, 2015. (19WO).

International Search Report and the Written Opinion for PCT/US2015/25043, dated Aug. 4, 2015. (20WO).

Kulite, Static-Dynamic Transducer, Jun. 17, 2009 (6 pages).

Hunter, Gary W., Development and Application of High Temperature Sensors and Electronics, NASA Glenn Research Center, Cleveland, OH (26 pages).

Kurtz, Dr. Anthony D., "Miniature Absolute Pressure Transducer," AFSBIR, Control No. F031-1261 (2003).

Ned, Alexander A.; Kurtz, Dr. Anthony D.; Masheeb, Fawzia; Beheim, Glenn, Leadless SiC Pressure Sensors for High Temperature Applications, 2001 (6 pages).

Ned, Alexander A.; Kurtz, Anthony D.; Beheim, Glenn; Masheeb, Fawzia; Stefanescu, Sorin; Improve SiC Leadless Pressure Sensors for High Temperature Low and High Pressure Applications; Kulite Semiconductor Products, Inc., presented at the 21st Transducer Workshop,.

Wijesundara, Muthu, Recent Progress in SiC Sensors and Microsystems for Harsh Environments (19 pages).

(56) References Cited

OTHER PUBLICATIONS

Inagaki, K.; Kolosov, O.V.; Briggs, G. A. D.; Wright, O. B.; Waveguide ultrasonic force microscopy at 60 MHz; Applied Physics Letters, vol. 76, No. 14, Apr. 3, 2000 (3 pages).
Schuet, S; Wheeler, K.; Timucin, D.; Kowalski, M.; Wysocki, P.; Introduction & Motivation Characterization of Chafing Damage Model Based Inference, Model Based Inference for Wire Chafe Diagnostics, Intelligent Systems Division, NASA Ames Research Center, Moffett Field.
Rose, Joseph L., A Baseline and Vision of Ultrasonic Guided Wave Inspection Potential, Journal of Pressure Vessel Technology, Aug. 2002, vol. 124, pp. 273-282.
Neill, Ian T.; Oppenheim, I. J.; Greve, D.W.; A Wire-Guided Transducer for Acoustic Emission Sensing, Sensors and Smart Structures Technologies for Civil, Mechanical, and Aerospace Systems, 2007, Proc. of SPIE vol. 6529 652913-1 (8 pages).
Stobbe, David M., Acoustoelasticity in 7075-T651 Aluminum and Dependence of Third Order Elastic Constants on Fatigue Damage, A thesis Presented to the Academic Faculty, School of Mechanical Engineering, Georgia Institute of Technology, Aug. 2005 (91 pages).
Ali, M.G.S., Analysis of Broadband Piezoelectric Transducers by Discrete Time Model, Egypt. J. Sol., vol. (23), No. (2), (2000), pp. 287-295.
Greve, David W.; Sohn, Hoon; Yue, C. Patrick; Oppenheim, Irving J., An Inductively Coupled Lamb Wave Transducer, IEEE Sensors Journal, vol. 7, No. 2, Feb. 2007, pp. 295-301.
Huang, Bin; Shung, K. Kik, Characterization of very high frequency transducers with wire target and hydrophone, Institute of Physics Publishing, Journal of Physics: Conference Series 1 (2004) 161-166.
Hollman, Kyle W.; Holland, Mark R.; Miller, James G.; Nagy, Peter B.; Rose, James H., Effective Ultrasonic transmission coefficient for randomly rough surfaces, J. Acoust. Soc. Am. 100 (2), Pt. 1, Aug. 1996, pp. 832-839.
Kwun, Hegeon; Bartels, Keith A.; Hanley, John J., Effects of tensile loading on the properties of elastic-wave propagation in a strand, J. Acoust. Soc. Am 103 (6), Jun. 1998, pp. 3370-3375.
Nieuwenhuis, J. H.; Neumann, J.; Greve, D.W.; Oppenheim, I.J., Generation and detection of guided waves using PZT wafer transducers, Nov. 2005 (19 pages).
Chaki, S.; Bourse, G., Guided ultrasonic waves for non-destructive monitoring of the stress levels in prestressed steel strands, Ultrasonics 49 (2009) 162-171.
Li, Qiuhua; Lieh, Junghsen; Mayer, A, Large deflection of laminated circular plates with clamed edge and uniform loading, Proc. IMechE vol. 219 Part E: J. Process Mechanical Engineering (2005) (6 pages).
Sheplak, Mark; Dugundji, John, Large Deflections of Clamped Circular Plates Under Initial Tension and Transitions to Membrane Behavior, Journal of Applied Mechanics, 1998 (28 Pages).
Behbahani, Alireza R., Need for Robust Sensors for Inherently Fail-Safe Gas Turbine Engine Controls, Monitoring, and Prognostics, May 7, 2006 through Thursday, May 11, 2006, ISA2006, 52nd International Instrumentation Symposium—Cleveland, OH (37 pages).
Di Scalea, Francesco Lanza; Rizzo, Piervincenzo; Seible, Frieder, Stress Measurement and Defect Detection in Steel Strands by Guided Stress Waves, Journal of Materials in Civil Engineering © ASCE/May/Jun. 2003, pp. 219-227.
Miklowitz, Julius, The Theory of Elastic Waves and Waveguides, North-Holland Series in Applied Mathematics and Mechanics, vol. 22, 1978 (634 pages).
Nagy, Peter B.; Kent, Renee M., Ultrasonic assessment of Poisson's ratio in thin rods, J. Acoust. Soc. Am. 98 (5), Pt. 1, Nov. 1995, pp. 2694-2701.
Konkov, E., Ultrasonic Interferometer for High-Accuracy Linear Measurements, Measurement Science Review, vol. 9, No. 6, 2009, pp. 187-188.
Nicholson, N.C. and McDicken, W.N., "Waveguides in medical ultrasonics: effect of waveguide medium upon model amplitude," Ultrasonics 1992 vol. 30, No. 2. (pp. 82-86).
Spratt, William K.; Vetelino, John F.; Lynnworth, Lawrence C., "Torsional Ultrasonic Waveguide Sensor," 2010 IEEE International Ultrasonics Symposium Proceedings (pp. 702-706).
Loveday, Philip W., "Analysis of Piezoelectric Ultrasonic Transducers Attached to Waveguides Using Waveguide Finite Elements," IEEE Transactions on Ultrasonics, Ferroelectrics, and Frequency Control, vol. 54, No. 10, Oct. 2007 (pp. 2045-2051).
Lee, Jung-Ryul and Tsuda, Hiroshi, "Sensor application of fibre ultrasonic waveguide," Meas. Sci. Technol. 17 (2006) pp. 645-652.
Cegla, F.B.; Cawley, P., "Ultrasonic Waveguides for Remote High Temperature NDT," Non-Destructive Testing Group, Department of Mechanical Engineering, Imperial College London SW7 2AZ, United Kingdom.
Redwood, Martin, Mechanical waveguides; the propagation of acoustic and ultrasonic waves in fluids and solids with boundaries, New York, Pergamon Press. 1960.
U.S. Patent and Trademark Office, Restriction issued in related U.S. Appl. No. 13/166,594, dated Oct. 25, 2013.
U.S. Patent and Trademark Office, Restriction issued in related U.S. Appl. No. 13/166,594, dated Mar. 14, 2014.
U.S. Patent and Trademark Office, Office Action issued in related U.S. Appl. No. 13/166,594, dated Jul. 24, 2014.
U.S. Patent and Trademark Office, Final Office Action issued in related U.S. Appl. No. 13/166,594, dated Feb. 17, 2015.
U.S. Patent and Trademark Office, Advisory Action issued in related U.S. Appl. No. 13/166,594, dated May 14, 2015.
U.S. Patent and Trademark Office, Office Action issued in related U.S. Appl. No. 13/166,594, dated Jun. 19, 2015.
U.S. Patent and Trademark Office, Notice of Allowance issued in related U.S. Appl. No. 13/166,594, dated Aug. 7, 2015.
U.S. Patent and Trademark Office, Notice of Allowance issued in related U.S. Appl. No. 13/166,594, dated Sep. 17, 2015.
U.S. Patent and Trademark Office, Office Action issued in related U.S. Appl. No. 13/071,159, dated Apr. 23, 2014.
U.S. Patent and Trademark Office, Final Office Action issued in related U.S. Appl. No. 13/071,159, dated Oct. 24, 2014.
U.S. Patent and Trademark Office, Notice of Allowance issued in related U.S. Appl. No. 13/071,159, dated Apr. 15, 2015.
U.S. Patent and Trademark Office, Office Action issued in related U.S. Appl. No. 15/033,383, dated Apr. 3, 2018.
U.S. Patent and Trademark Office, Office Action issued in related U.S. Appl. No. 15/033,350, dated Jun. 29, 2018.
U.S. Patent and Trademark Office, Office Action issued in related U.S. Appl. No. 15/033,383, dated Nov. 1, 2018.
U.S. Patent and Trademark Office, Office Action issued in related U.S. Appl. No. 15/302,836, dated Aug. 20, 2019.
International Search Report and the Written Opinon for PCT/US2018/26935, dated Feb. 19, 2019. (19WO).
International Search Report and the Written Opinon for PCT/US2018/26937, dated Jan. 8, 2019. (19WO).
International Search Report and the Written Opinon for PCT/US2018/26940, dated Jun. 28, 2018. (19WO).
U.S. Patent and Trademark Office, Notice of Allowance issued in related U.S. Appl. No. 15/033,383, dated Apr. 2, 2019.
U.S. Patent and Trademark Office, Office Action issued in related U.S. Appl. No. 15/302,836, dated Mar. 23, 2020.

\* cited by examiner

BROADBAND WAVEGUIDE

GOVERNMENT RIGHTS

Certain aspects of this invention were made with government support under Grant/Contract No. FA8650-12-M-2278 awarded by the Air Force Research Laboratory, Propulsion Directorate. The U.S. Government may have certain rights in the invention.

FIELD OF THE INVENTION

The present invention relates to waveguides for transmitting a signal from proximate one end thereof to an intermediate location thereof.

BACKGROUND OF THE INVENTION

Many conventional mechanical systems are monitored to determine the health thereof and the vibrations caused thereby. However, there are many instances where it is desirable to make broadband measurements of vibration or other physical quantities at locations where it is extremely difficult to do so. For example, the measurement environment may be a harsh environment in which sensors are unable to operate reliably, an environment in which access is so limited that a sensor cannot be physically mounted at the desired location, or an environment in which access is so limited that a sensor cannot be replaced or repaired in the event of failure.

Some conventional methods of dealing with the above issues have generally involved embedding a piezoelectric vibration or strain sensor at the location to be measured and acknowledging that its lifetime and measurement capabilities are limited by the environment within which it is configured. Other conventional methods of dealing with the above issues have involved a mechanical waveguide transmitting a signal at a single, stationary frequency or a signal for which it is unimportant to detect the correct relative phase and/or amplitude of various frequencies. For example, in ultrasonic non-destructive testing of metal die castings, a simple rod of metal may act as a waveguide to isolate an ultrasonic sensor from a hot test location, with one end of the rod at the location to be tested and the other end connected to the sensor. As the casting is heated it expands and as the casting cools it shrinks, which can result in cracks within the casting. Each crack, in turn, can be detected using very high frequency (VHF) energy transmitted through the waveguide. However, when the measurement of the actual amplitude and/or phase characteristics of the signal across a frequency band is important rather than the mere detection of cracks using average VHF energy or other techniques using a fixed frequency signal, a traditional waveguide cannot be used, as the ultrasonic signal reflects within the waveguide, resulting in resonances which distort the signal characteristics, making broadband measurements generally impossible.

This drawback of conventional waveguides is that they often have one or more resonant frequencies that in turn may cause large peaks and valleys in the spectrum of any signals transmitted thereby. Resonances are often caused by reflections of a signal from the ends of the waveguide. More particularly, a signal initiated at the sensing end of the waveguide travels down the waveguide and reflects off the non-sensing end, then travels back down the waveguide to the sensing end, is reflected off the sensing end back to the non-sensing end, etc. Considered from the perspective of the frequency domain, if there is a periodic signal at a frequency such that the period of the signal is equal to the time it takes for the signal to travel to the end of the waveguide and back to the sensing end, the reflection and the periodic signal will be in phase and re-enforce each other. This creates a standing wave or resonance in the waveguide. The amplitude of the signal response is very large at these frequencies and is very low at intermediate frequencies where the periodic signal and reflected signal cancel each other out rather than re-enforce. This significantly affects sensor readings, rendering detection of a particular signal generally useless.

Consequently, there is a continuing need for improving signal detection with waveguides to address these and other difficulties with conventional waveguide technology.

SUMMARY OF THE INVENTION

Embodiments of the invention are generally directed to a broadband waveguide, as well as methods of making and using same, in which reflections of signals communicated over one or more filaments in such a waveguide are suppressed through one or more unique suppression techniques disclosed herein. Consistent with some embodiments of the invention, a waveguide may comprise at least one filament, and in some embodiments, the waveguide may comprise multiple filaments bundled together. Consistent with embodiments of the invention, a damping material may cover/enclose at least a portion of the at least one filament to thereby suppress reflections of a signal transmitted over the broadband waveguide. In some embodiments a cladding material may similarly surround, encase, enclose, and/or cover at least a portion of the at least one filament to protect the at least one filament from damage and to prevent energy from entering/escaping the waveguide. In addition, embodiments of the invention may include a sensor coupled to the broadband waveguide to measure a signal transmitted over the at least one filament of the broadband waveguide.

Furthermore, in some embodiments of the invention, at least one filament of a broadband waveguide may be configured with one or more reflection points at one or more locations along a length of the at least one filament to thereby cancel a signal reflected by the filament associated with a transmitted signal. Moreover, consistent with some embodiments of the invention, at least one filament of a broadband waveguide may be coupled to a securing element that is configured to couple the at least one filament to a surface for monitoring vibration energy thereof. In some embodiments the securing element may be configured to transmit vibration energy from the monitored surface to the at least one filament of the waveguide.

In addition, there are provided methods of manufacturing and/or assembling the above broadband waveguides consistent with embodiments of the invention.

These and other advantages will be apparent in light of the following figures and detailed description.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

It should be understood that the appended drawings are not necessarily to scale, presenting a somewhat simplified representation of various features illustrative of the basic principles of embodiments of the invention. The specific design features of embodiments of the invention as disclosed herein, including, for example, specific dimensions, orientations, locations, and shapes of various illustrated components will be determined in part by the particular intended application and use environment. Certain features of the illustrated embodiments may have been enlarged or distorted relative to others to facilitate visualization and clear understanding.

DETAILED DESCRIPTION

Embodiments of the invention provide a broadband waveguide and methods of making and using the same. Some embodiments of the invention may be configured with a suppression material that covers at least a portion of at least one filament of a waveguide to reduce reflections in signals communicated by such waveguides. Some embodiments of the invention may be configured with a cladding material that covers at least a portion of at least one filament of a waveguide to protect such waveguides from damage and/or reduce energy escaping and/or entering such waveguides. Furthermore, in some embodiments, at least one filament of a waveguide may be configured with one or more reflection notches thereon, where each one or more reflection notch may be configured to reflect at least one frequency of a signal transmitted therethrough as a cancellation signal, where such cancellation signal may include a frequency configured to cancel a reflected signal associated with a reflection point such as an end of the at least one filament. In some embodiments, at least one filament may be coupled to an at least partially conical securing member configured to couple to at least one surface.

Figure 1:
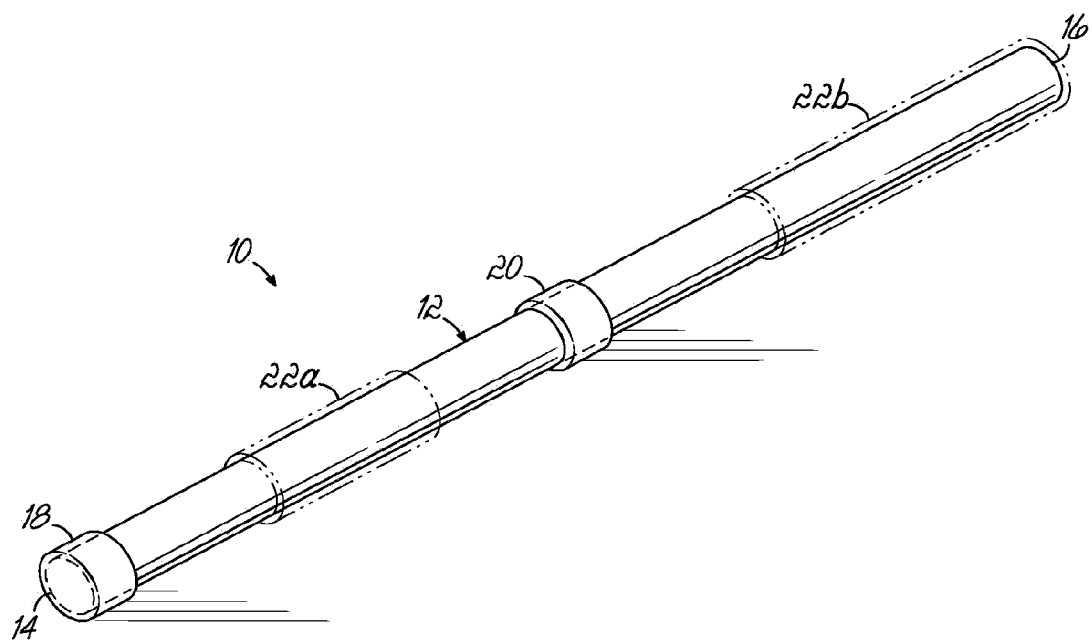
FIG. 1 is a perspective illustration of a broadband waveguide that includes one filament consistent with embodiments of the invention.

Turning now to the figures, FIG. 1 is a perspective illustration of a broadband waveguide 10 consistent with one embodiment of the invention. As illustrated in FIG. 1, the waveguide 10 includes one filament 12 having a first end 14 and a second end 16. The filament 12, in various embodiments, may be configured from metal, ceramic, alloys, plastic, carbon-fiber, and/or another material that may transmit of a force signal (e.g., a vibration at a particular frequency range), pressure signal, or other stress wave along at least a portion of the length thereof. Such sensed signals consistent with some embodiments of the invention may be mechanical stress waves, vibration, etc. The filament 12 may be configured from one material, such as a metal wire (e.g., and thus have a substantially uniform cross-section), or may be configured from two or more materials, such as a clad or sheathed wire (e.g., and thus have a non-uniform cross-section). Moreover, the at least one filament may comprise metal, metal alloys, ceramic, and/or other such materials. In those embodiments in which the filament 12 is clad, an inner portion (e.g., the "core") may be configured from a first material while an outer portion (e.g., the "cladding" or "sheathing") may be configured from a second material. In some embodiments, the cladding may be a metal. As such, the cladding may act to prevent noise from being introduced to the core, protect the core from being damaged, protect outside materials from being damaged by the core, and/or for robustness of the filament 12. In some embodiments in which the filament 12 is configured from a metal, the filament 12 of the waveguide 10 may be configured from about 0.020" to about 0.040" diameter stainless steel wire, or high temperature steel alloy such as Inconel® of approximately one meter length. The diameter ranges provided above are merely an example range and the invention is not so limited. For example, in some embodiments the diameter of a filament 12 may vary based on application.

A first matrix 18 is configured proximate the first end 14 of the filament 12 while a second matrix 20 is configured proximate an intermediate location between the first end 14 and the second end 16. As such, at least a portion of the filament 12 extends beyond the second matrix 20 along a longitudinal direction of the filament 12 (e.g., along the length of the filament 12 in the direction from the first matrix 18 to the second matrix 20). The first matrix 18 is configured to provide a material through which to attach the filament 12 to a location (e.g., such as a structure to be monitored) and/or to a securing element such as a substantially conical member. In specific embodiments, the first matrix 18 may be threaded to correspond to a thread at the location and/or on the securing element. As such, the first matrix 18 may be screwed into the location and/or securing element. Alternatively, the first matrix 18 may be stud mounted, soldered, welded, brazed, epoxied, adhered, or otherwise attached to the location and/or securing element. The second matrix 20 is configured to provide a material through which to sense the signal transmitted through at least a portion of the filament 12 as well as a material upon which to mount a sensor 60 (FIG. 3) to sense the signal transmitted through at least a portion of the filament 12.

In various embodiments, the first matrix 18 and/or the second matrix 20 may be configured from a metal, a frit, an adhesive, an epoxy, a piezoelectric material, or a piezo-resistive material. Additionally and/or alternatively, the first matrix 18 and/or the second matrix 20 may be formed through brazing, welding, or soldering of the filament itself.

In some embodiments, at least a portion of the filament 12, the first matrix 18, and/or the second matrix 20 may be at least partially engaged, covered, or enveloped by a damping material 22a, 22b. More specifically, at least a portion of the filament 12 between the first matrix 18 and the second matrix 20 may be covered or otherwise engaged by the damping material 22a, while the portion of the filament 12 that extends beyond the second matrix 20 may be engaged by the damping material 22b. The damping material 22a may operate to suppress extraneous signals being introduced between the first matrix 18 and the second matrix 20. The damping material 22b, however, operates to suppress reflections of the signal introduced proximate the first matrix 18 from the second end 16 of the filament 12. Suitable damping materials may comprise, for example, rubber, a visco-elastic material, a fluid, batting, ceramic (e.g., for high temperature environments), a tungsten powder impregnated epoxy, a heterogeneous metal and plastic mixture, polyolefin shrink tubing, and/or another material that operates to constrain or absorb energy near the second end 16 to mitigate reflections of the signal thereby.

Figure 2:
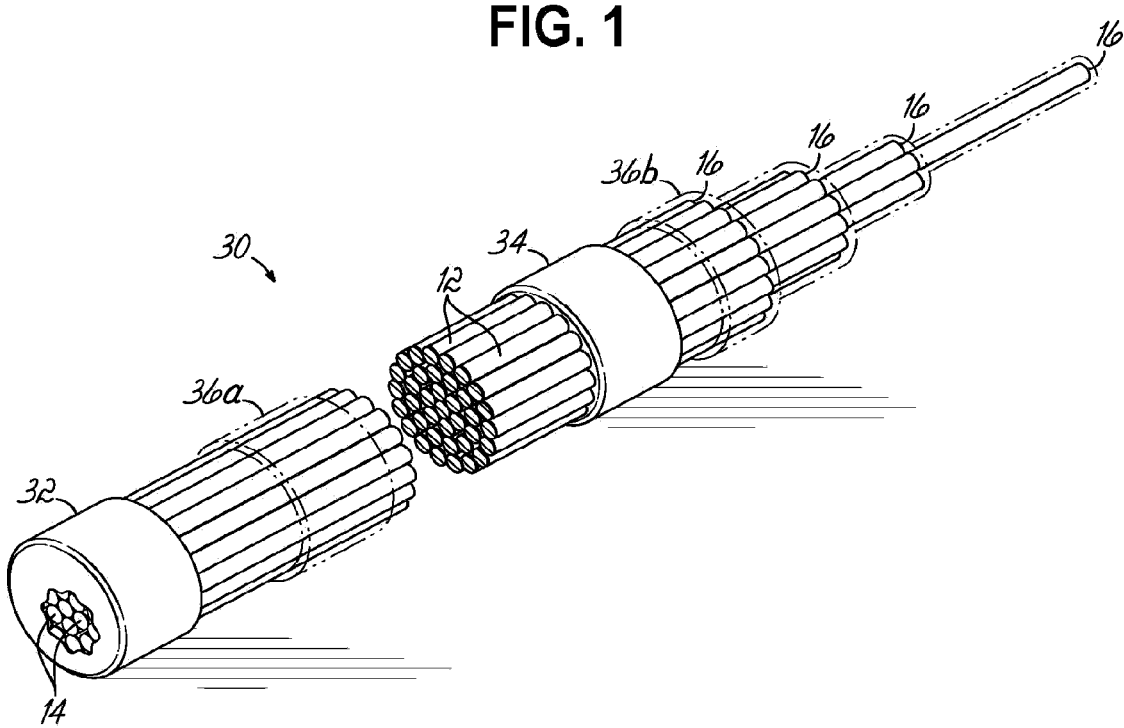
FIG. 2 is a perspective illustration of a broadband waveguide that includes a plurality of filaments consistent with embodiments of the invention.

FIG. 2 is a perspective illustration of another broadband waveguide 30 consistent with an alternative embodiment of the invention. Unlike the waveguide 10 of FIG. 1, the waveguide 30 of FIG. 2 includes a plurality of filaments 12. However, each filament 12 still includes a first end 14 and a second end 16. The plurality of filaments 12 are coupled to one another by way of a first matrix 32 proximate the respective first ends 14 thereof and coupled to one another by way of a second matrix 34 proximate an intermediate location between the respective first ends 14 and second ends 16 thereof. As such, the first matrix 32 and the second matrix 34 are configured to secure the filaments 12 in a bundle. In specific embodiments, the filaments 12 of the waveguide 30 are, about 0.034" diameter stainless steel wire that are formed, by the first matrix 32 and the second matrix 34, into bundles about 0.25" in diameter. In further specific embodiments, the length of the waveguide 30 is approximately one meter.

Similarly to the first matrix 18 and/or second matrix 20, the first matrix 32 and/or the second matrix 34 may be configured from a metal, a frit, an adhesive, an epoxy, a piezoelectric material, or a piezo-resistive material. Additionally, the first matrix 32 and/or the second matrix 34 may be formed through brazing, welding, or soldering of the filaments themselves.

Similarly to the waveguide 10, at least a portion of the filaments 12, the first matrix 32, and/or the second matrix 34 of the waveguide 30 may be at least partially engaged, covered, or enveloped by a damping material 36a, 36b. More specifically, at least a portion of the filaments 12 between the first matrix 32 and the second matrix 34 may be engaged by the damping material 36a, while the portions of the filaments 12 that extend beyond the second matrix 34 may be engaged by the damping material 36b.

In some embodiments, at least two filaments 12 in the waveguide 30 that have portions that extend beyond the second matrix 34 have differing lengths. These differing lengths operate to suppress reflections of a signal introduced proximate the first matrix 32 from the respective second ends 16 of the filaments 12. More specifically, the reflected signals from the respective second ends 16 of the at least two filaments 12 are generally at a different phase of the signal such that, when combined, the individual components of the reflected signals do not add constructively. As illustrated in FIG. 2, four sets of filaments 12 have portions that extend beyond the second matrix 34. In particular, each filament 12 within a set has the same length, while each set of filaments 12 has a length that differs from the other sets of filaments 12. In alternative embodiments, each of a plurality of filaments 12 in the waveguide 30 has a portion that extends beyond the second matrix 34 with a length that differs from each other filament 12 in the waveguide 30.

Figure 3:
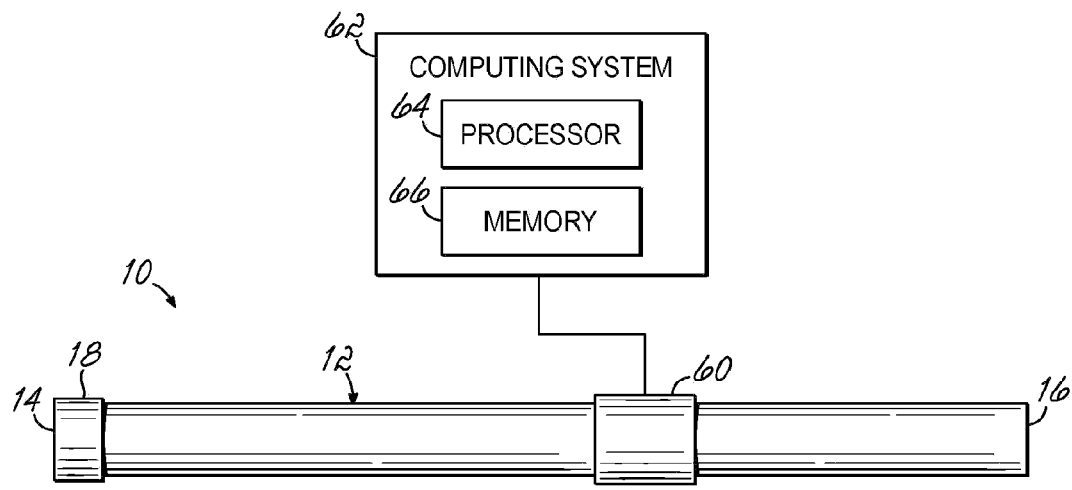
FIG. 3 is a block diagram of the broadband waveguide of FIG. 1 including a sensor that is coupled to a computing system consistent with some embodiments of the invention.

In operation, the waveguides 10, 30 transmit a signal introduced proximate the respective first matrices 18, 32 to a measurement location for measurement. In particular, and as illustrated in FIG. 3, at least one filament may be coupled to a sensor 60 at a measurement location. The sensor 60 may measure axial strain, radial strain, and/or surface motion of the at least one filament 12 of the waveguide 10. A computing system 62 may be coupled to the sensor 60 to store and/or analyze the signal detected by the sensor 60. As shown in FIG. 3, in some embodiments, the sensor 60 may cover/enclose at least a portion of the at least one filament 12. Although not shown, it will be appreciated that in some embodiments at least a portion of a second matrix configured on the at least one filament 12 may also be machined to receive the sensor 60 such that the sensor can measure the axial strain, radial strain, and/or surface motion of the filament 12 thereof.

Figure 4:
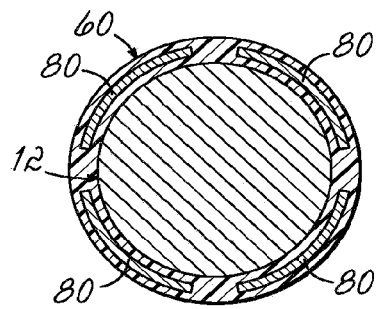
FIG. 4 is a cross-sectional view of a filament of a waveguide of FIG. 1 or 2 including a piezoelectric polymer film sensor tangentially bonded to at least a portion of the filament.

The sensor 60 may be a strain sensor, piezoelectric sensor, accelerometer, motion sensor, load meter, or other force sensor, and the sensor may measure axial strain, radial strain, and/or surface motion of the at least one filament of the waveguide. In some embodiments, the sensor 60 may comprise strain gauge and the at least one filament 12 may transmit vibration energy along the at least one filament 12 to measurement location at which the sensor may be coupled. In some embodiments, the sensor may comprise a piezoelectric strain gauge. In some embodiments, the sensor may comprise a piezoelectric polymer film configured to measure strain. In embodiments comprising a sensor of piezoelectric polymer film, the sensor 60 may be coupled to the at least one filament 12 about the circumference of the at least one filament, where such coupling may comprise tangentially bonding the polymer film to a surface of the at least one filament 12. For example, a piezoelectric polymer film sensor may comprise a polyvinylidene fluoride film (PVDF) configured with metalized leads that include metals and/or metal alloys such as nickel, silver, copper, and/or other such metals and alloys. In general, the computing system 62 may include a processor 64 and memory 66. FIG. 4 is a cross-sectional illustration of a filament 12 including a sensor 60 circumferentially bonded to at least a portion of the filament 12. In this example, the sensor may comprise a piezoelectric polymer film including metallization elements 80 configured therein that may be connected to an input of the computing system 62. As shown, the sensor 60 may include one or more metallization elements 80 that may be spaced apart in the polymer film of the sensor 60.

Furthermore, in some embodiments, a potentially piezoelectric material or a piezoelectric material may be disposed (e.g., bonded, deposited, formed, cast, extruded, etc.) to at least a portion of the waveguide, such as the measurement location. Generally, an attachment material may be electrically conductive (e.g., forming one or more electrical connections) in some embodiments, while in other embodiments the attachment material may be non-conductive After disposing the potentially piezoelectric material/piezoelectric material, poling may be performed on the material. In general, poling a material refers to subjecting the material to a constant electric field to adjust dipoles of the material to a more aligned position. With regard to a potentially piezoelectric material (such as a ferroelectric ceramic material), poling the material may induce piezoelectric properties in the material. Similarly, poling a piezoelectric material may improve piezoelectric properties. Therefore, consistent with some embodiments of the invention a material (e.g., a piezoelectric/potentially piezoelectric) may be disposed on at least a portion of at least one filament and poling may be performed thereon to thereby produce a piezoelectric material. The piezoelectric material may be utilized for a sensor.

While FIGS. 3 and 4 illustrate the sensor 60 as coupled to the surface of the at least one filament 12, the invention is not so limited. In some embodiments, a sensor 60 may be coupled to a machined portion of a waveguide, such as the second matrix 20, 34 of the waveguides 10, 30 of FIGS. 1 and 2. In other embodiments, a sensor may be coupled to a structure machined to at least one filament of a waveguide. For example, in some embodiments a sensor comprising a piezoelectric element may be coupled to a substantially conical structure that is coupled to at least one filament of the waveguide. As will be appreciated, some embodiments of the invention may comprise a sensor having a piezoelectric element.

Waveguides 10, 30 consistent with embodiments of the invention may be used for broadband vibration or pressure measurement in hostile environments (e.g., environments with extremely high or low temperatures, corrosive fluids or gases, risks of mechanical damage, high electromagnetic fields) in which the sensor 60 cannot operate reliably and efficiently. Such hostile environments may include environments associated with aircraft (e.g., in the engines thereof, such as to measure vibrations of bearings thereof or to measure pressure inside combustion chambers thereof), pumping systems, marine propulsion, land propulsion, power generation, fan systems, blower systems, boilers, and/or other machinery associated with hazardous fluids or harsh or inaccessible locations, such as steel furnaces, nuclear facilities, wastewater treatment plants, and liquid natural gas processes. Moreover, the waveguides 10, 30 may be used for broadband vibration or pressure measurement in otherwise inaccessible environments, such as sealed compressors or for health monitoring of large structures such as buildings and bridges, as they can be imbedded in concrete to reach supports, anchors, rebar, etc., while having the second matrices 20, 34 thereof in a convenient location for easy replacement of the sensor 60 attached thereto.

Figure 5:
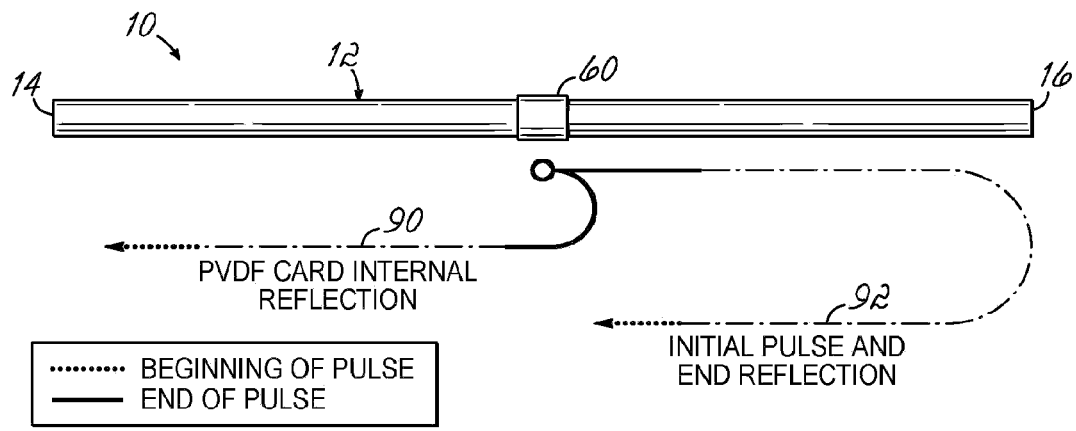
FIG. 5 is a block diagram of the waveguide of FIG. 1 including a sensor and illustrating example reflection signals that may be caused by an end of the filament and/or a sensor coupled to the filament.

Referring to FIG. 3, consistent with some embodiments of the invention, the waveguide 10 is used to transmit a measurement signal, such as a force signal, pressure signal, or other stress wave, along the filament 12. In general, a signal may be caused by an environmental condition at a sensing location, such as temperature, pressure, vibration, and/or other such environmental conditions. The signal is introduced proximate the first matrix 18 and transmitted along the filament 12 to the measurement location at which the sensor 60 is positioned. As the signal travels down the filament 12 it causes both axial and radial strain. These strains, or the surface motion of the filament 12 caused by these strains, may then be measured by the sensor 60 at the measurement location. FIG. 5 provides a diagrammatic illustration of a waveguide 10 and possible reflection signals 90, 92 that may occur therein based on the transmitted measurement signal. As shown, in some embodiments, the sensor 60 may cause a reflection signal 90 based on the transmitted measurement signal and/or the second end 16 may cause a reflection signal 92 based on the transmitted measurement signal. Consistent with embodiments of the invention, damping material and/or the one or more reflection notches may at least partially suppress and/or cancel such reflection signals. This allows a higher fidelity measurement of the signal transmitted along the filament 12 because standing waves or resonances of the signal within the waveguide 10 are at least partially prevented.

Figure 6:
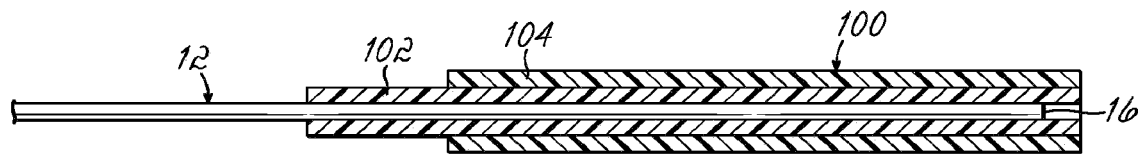
FIG. 6 is a side view of a filament of the waveguide of FIG. 1 or 2 including damping material coupled thereto consistent with some embodiments of the invention.

Turning now to FIG. 6, this figure provides a diagrammatic illustration of an example filament 12 of a waveguide consistent with embodiments of the invention in which damping material 100 is configured thereon. As discussed above, a first end of a filament of a waveguide may be coupled to a surface for which a measurement is desired. In this example, a second end 16 of such a filament 12 may be configured with damping material 100 to at least partially suppress reflection signals that may be caused at the second end 16 of the filament 12 in response to a measurement signal transmitted from the surface at which the first end is coupled. In this example, the damping material 100 may comprise two layers 102, 104 of different lengths. While in this example, the damping material 100 comprises two layers 102, 104 of different lengths, the invention is not so limited—i.e., the damping material may comprise one or more layers, of the same or different lengths, where in some embodiments the material composition of each layer may also be the same or different. For example, in some embodiments, the damping material may comprise a polymer based material composition, where a first layer may be of a first density and a second layer may be of a second density. Similarly, the damping material may comprise a first layer comprising a first material (e.g., polyolefin) and a second layer comprising a different second material. In some embodiments, a particular material may be utilized as a damping material based at least in part on an attenuation coefficient or other such material properties associated therewith. Moreover, a defined length of the damping material may be based at least in part on an application of the broadband waveguide. For example, at least one filament of a waveguide may vary in length based on application (e.g., depending on a distance between a sensing location and a measurement location), and in this example, a damping material length may similarly vary based on the application and/or the length of the at least one filament.

Figure 7:
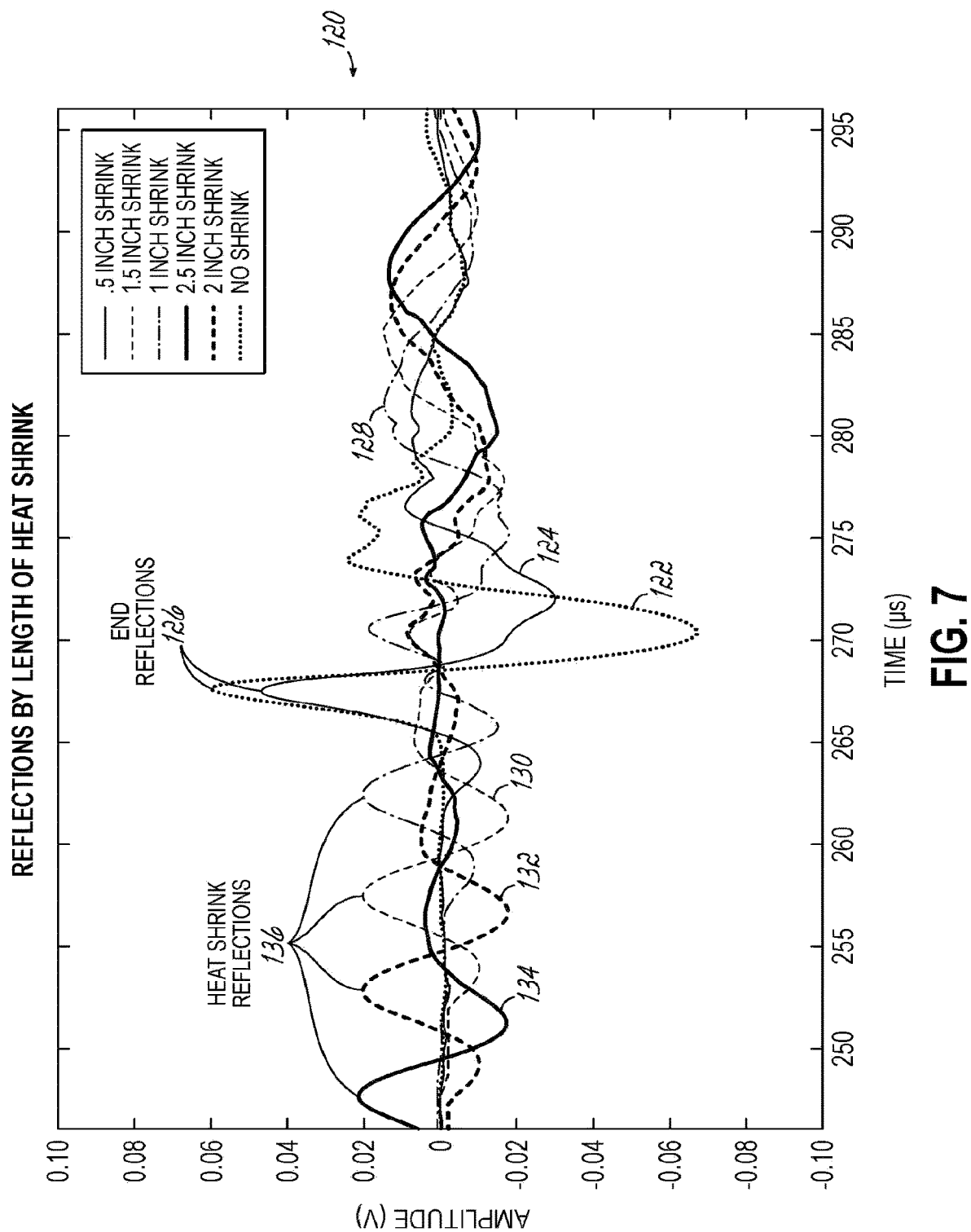
FIG. 7 is an example time domain response chart that illustrates signal reflections for waveguides of FIG. 1 or 2 including various lengths of damping material.

FIG. 7 provides an example chart 120 that compares different lengths of polyolefin shrink tubing that may be configured on a filament consistent with some embodiments of the invention with regard to effect on a reflection signal. As shown, a filament not configured with a damping material ('No Shrink' 122) and a filament configured with about 0.5" of polyolefin shrink tubing ('0.5 Inch Shrink' 124) may include a reflection signal peak 126 associated with the end of the filament. Similarly, filaments configured with polyolefin shrink tubing of about 1" ('1 Inch Shrink' 128), about 1.5" ('1.5 Inch Shrink' 130), about 2" ('2 Inch Shrink' 132), and about 2.5" ('2.5 Inch Shrink' 134) may include a reflection signal peak 136 associated with an end of the polyolefin shrink tubing. In general, the reflection signal peaks 136 associated with the end of the polyolefin shrink tubing may be acceptable as the amplitude of such peak may be an order of magnitude less than the amplitude of a measurement signal peak. However, a reflection signal peak 126 associated with an end of the filament may interfere with sensing the measurement signal with a sensor. Therefore, consistent with some embodiments of the invention, a damping material length may be about 0.5" or greater. In some embodiments, the damping material length may be at least about 1". In further embodiments, the damping material length may be at least about 2". In general, the length associated with the damping material may be based at least in part on the properties of the waveguide (e.g., length of one or more filaments, type of sensor used, etc.), the material(s) and/or material properties of the damping material, and the intended use of the waveguide (e.g., the expected frequency and amplitude of the measurement signal, the environmental conditions in which the waveguide may be utilized, etc.). Therefore, embodiments of the invention are not so limited to the lengths provided in this example.

As discussed previously, in some embodiments, a cladding material may be coupled to at least one filament of a waveguide. Such coupling and/or mounting may be referred to as the at least one filament being clad with the cladding material, where at least a portion of the at least one filament may generally be enclosed/sheathed by the cladding material, similar to the damping material described above. In general, at least a portion of a filament may be clad with a cladding material to protect the waveguide from damage and to at least partially reduce energy entering and/or escaping the waveguide. For example, if a filament is positioned proximate a surface, the cladding material may reduce the amount of energy from a measurement signal that escapes (i.e., is transmitted) into the proximate surface. Similarly, if the filament is positioned proximate a vibrating surface, the cladding material may reduce the amount of energy from the vibrating surface that enters (i.e., is transmitted) into the filament. Moreover, in some embodiments a cladding material may provide a hermetic seal.

In general, a cladding material may comprise a material having a lower attenuation coefficient as compared to a damping material; the attenuation coefficient may generally correspond to a damping coefficient, where a low damping coefficient may indicate that the material would not absorb a high amount of energy. For example, a damping material may have an attenuation coefficient generally in a range that corresponds to a waveguide's frequency range. For example, if a waveguide is configured to operate in a range below 100 kHz, a suitable damping material may have an attenuation coefficient related to the below 100 kHz operating range of the waveguide. In this example, an acceptable cladding material may have an attenuation coefficient below the attenuation coefficient of the damping material. In general, an attenuation coefficient is related to an amount of energy which a material may absorb, where a higher attenuation coefficient corresponds to an ability to absorb a higher amount of energy. With this in mind, a damping material generally absorbs energy (i.e., dampens), while a cladding material generally absorbs less energy than a damping material. In some embodiments of the invention, a portion of at least one filament may be clad with a cladding material, such as, for example, Teflon, fiberglass, and/or other such materials having a low attenuation coefficient. In general, a suitable cladding material may also be based at least in part on material properties, waveguide design, and/or the environmental conditions in which the waveguide is intended to operate.

Consistent with some embodiments of the invention, at least one filament of a waveguide may be configured with at least one reflection point. In general, some embodiments of the invention may be configured to transmit broadband vibration from one location to another by transmitting vibration energy as a signal (i.e., a measurement signal) through at least one filament (i.e., a broadband waveguide). For the energy transmission to be broadband, the transmission path (i.e., the at least one filament) is generally flat with regard to frequency. However, due to the nature of the at least one filaments, reflections of the transmitted vibration energy may cause standing reflection waves (i.e., reflection signals) to be present in the transmission path. The reflection signals produce periodic peaks in the transmission path which may interfere with sensing the measurement signal with a sensor. Embodiments of the invention may include one or more reflection points configured on a filament such that a reflection signal caused by the reflection point may interfere with a reflection signal caused by an end of the filament and thereby reduce and/or cancel the reflection signal caused by the end of the filament. For example, the reflection point may be located a determined length from the end of the filament such that a reflection signal caused by the reflection point and a reflection signal caused by the end of the filament are out of phase for a given wavelength. For cancellation, the reflection signal caused by the reflection point and the reflection signal caused by the end of the filament may generally comprise similar/identical amplitudes.

Figure 8:
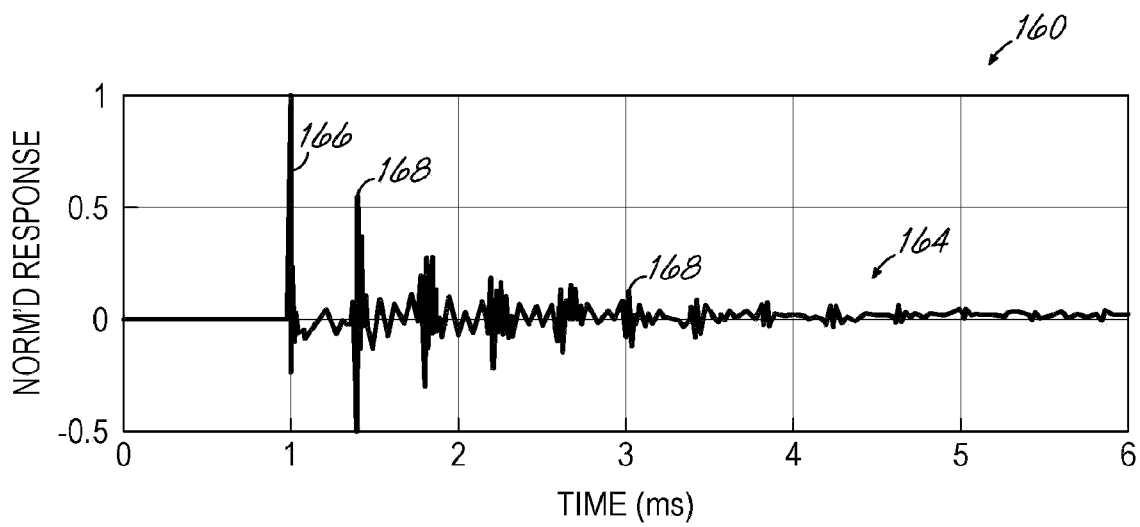
FIG. 8 is an example time domain response chart that illustrates example signal reflections for a waveguide of FIG. 1 or 2 that does not include damping material.
Figure 9:
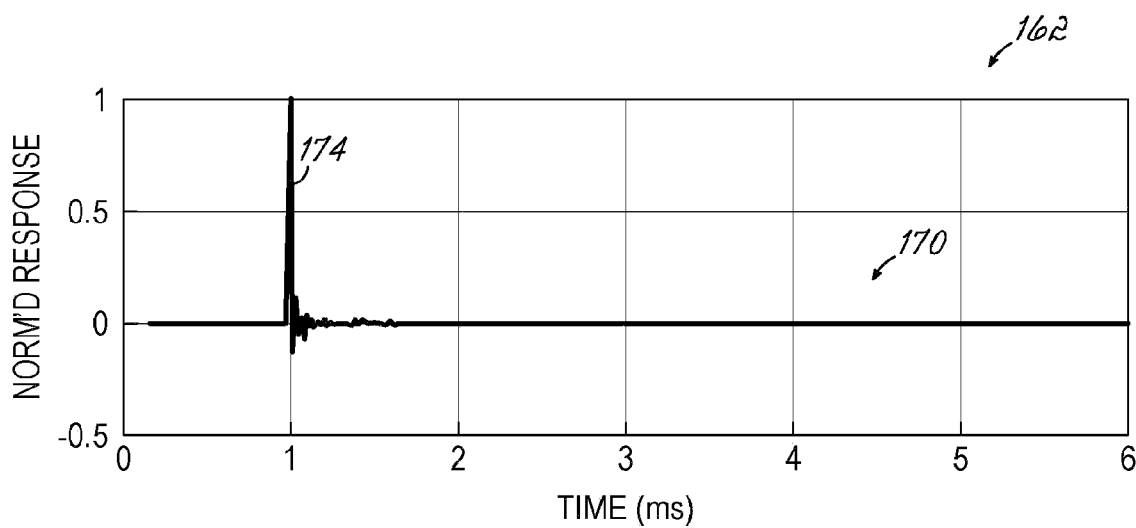
FIG. 9 is an example time domain response chart that illustrates example signal reflections for a waveguide of FIG. 1 or 2 that includes damping material and/or one or more reflection points consistent with embodiments of the invention.
Figure 10:
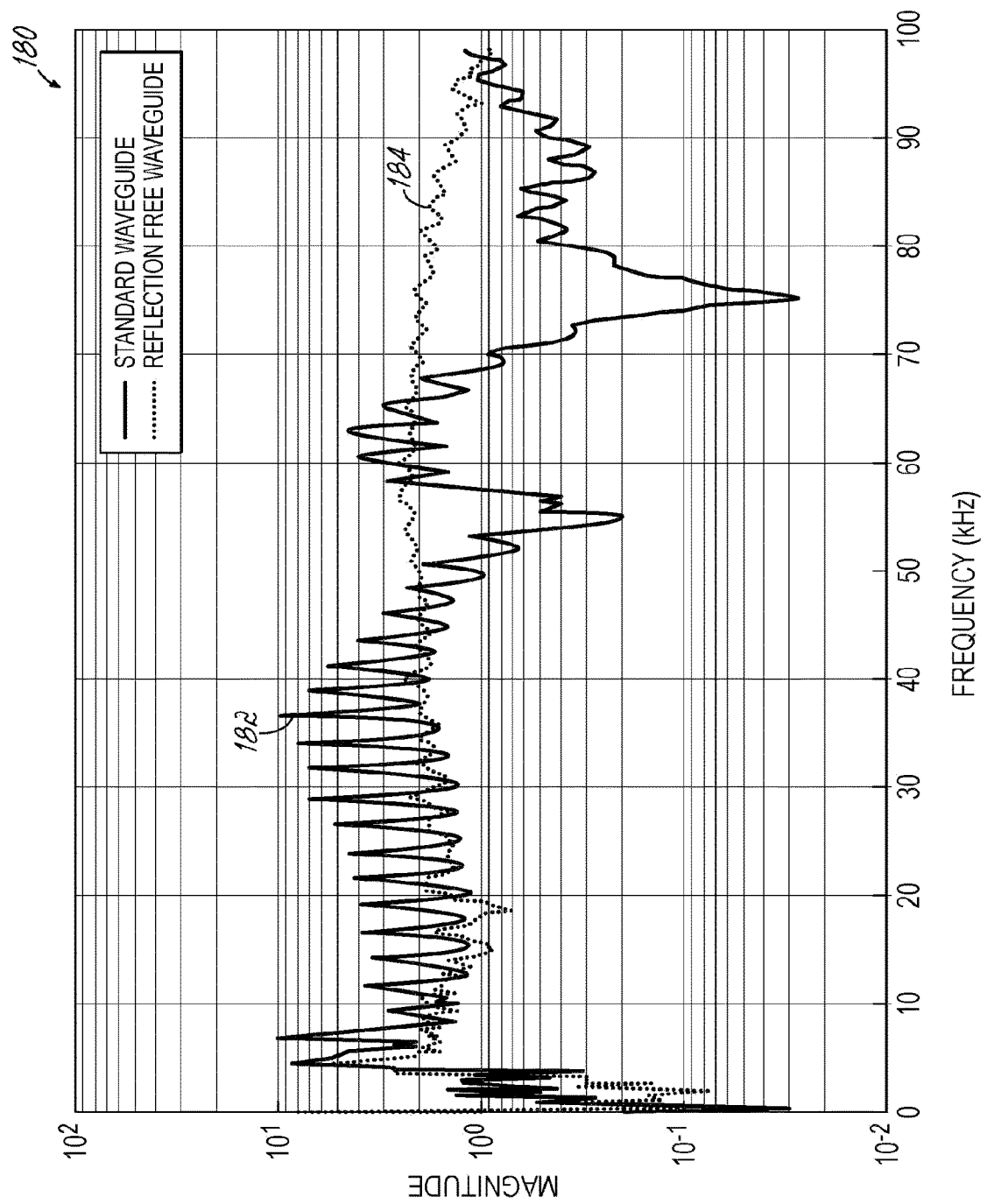
FIG. 10 is an example frequency domain response chart that illustrates example signal reflections for a waveguide of FIG. 1 or 2 including or not including damping material and/or reflection points.

FIGS. 8 and 9 provide example time domain response charts 160, 162 for waveguides in response to an impulse. Referring to FIG. 8, this chart 160 illustrates an example response trace 164 for a waveguide in which standing waves (i.e., reflection signals) are not suppressed and/or cancelled. As illustrated by the example response trace 164, the trace 164 sensed by a sensor may include an impulse peak 166 (associated with the measurement signal) but without reflection suppression/cancellation, one or more reflection peaks 168 (associated with reflection signals) may also be sensed by the sensor. In contrast, FIG. 9 illustrates an example response trace 170 in which reflection signals have been cancelled. As illustrated, the trace 170 includes an impulse peak 174 (associated with a measurement signal), but the trace 170 does not include subsequent peaks associated with reflections. FIG. 10 provides an example frequency domain response chart 180 related to the time domain response charts 160, 162 of FIGS. 8 and 9 that include an example response trace for a waveguide that does not suppress/cancel reflection signals 182 (labeled 'Standard Waveguide') and an example response trace for a waveguide that does suppress/cancel reflection signals 184 (labeled 'Reflection Free Waveguide'). As illustrated, the Standard Waveguide trace 182 includes contamination associated with reflection signals due to periodic peaks caused by the reflections, while the Reflection Free Waveguide trace 184 does not include such contamination.

Figure 11:
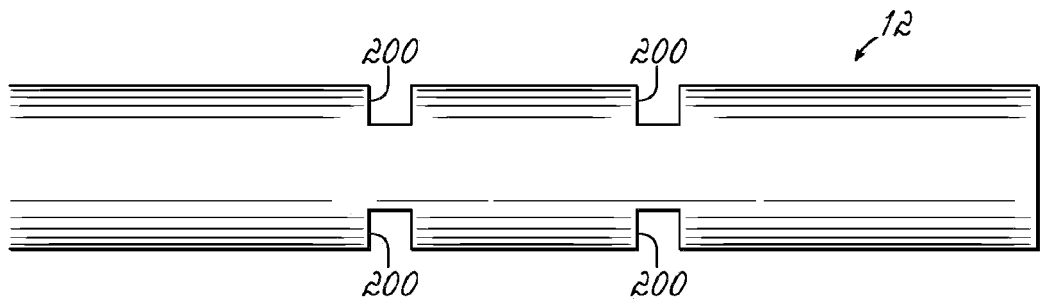
FIG. 11 is a side view of a portion of a filament of a waveguide of FIG. 1 or 2 configured with reflection points comprising reflection notches.
Figure 12:
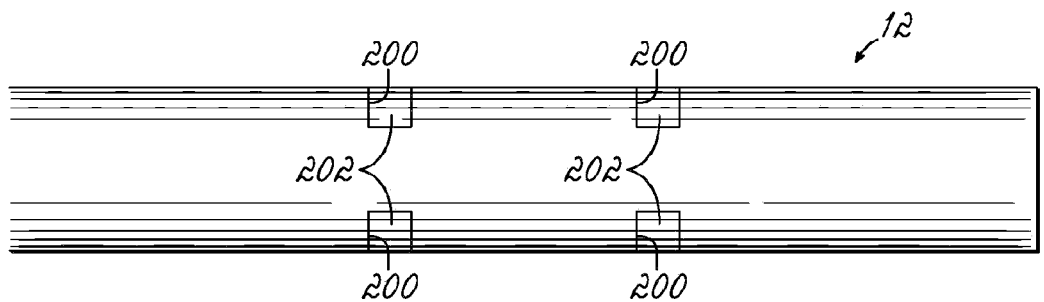
FIG. 12 is a side view of a portion of a filament of a waveguide of FIG. 1 or 2 configured with reflection points comprising a different material than the rest of the filament.

Therefore, consistent with embodiments of the invention, one or more filaments of a waveguide may be configured with one or more reflection points configured to cause a reflection signal that interferes with and/or cancels at least one other reflection signal. In some embodiments, a reflection point may comprise a reflection notch configured in the filament. In these embodiments, a filament may comprise one or more reflection notches configured to cause a reflection signal that is out-of-phase with at least one other reflection signal (such as a reflection signal from an end of the filament). FIG. 11 provides a side view of a portion of a filament 12 configured with reflection notches 200. As will be appreciated, in some embodiments of the invention, a reflection notch may comprise an at least partially circumferential notch. Turning to FIG. 12, this figure provides a side view of a portion of a filament 12 configured with reflection points 202 comprising a different material than the rest of the filament 12. In these embodiments the reflection point 202 may comprise a particular material configured in a particular location of the filament 12, where the material used for the reflection point may have different material properties than the material properties of the material of the rest of the filament 12 and thereby cause at least a partial reflection of a signal transmitted on the filament 12.

In general, standing waves (i.e., reflection signals) may be created by reflection points at ends of a filament based on transmitted energy (i.e., the measurement signal) and a length of the filament. The wavelength (λ) for a signal in a filament may be given by:

$$\lambda = \frac{c}{f},$$

where c is a material specific wave propagation velocity associated with the filament and f is the frequency. For a waveguide of length (l), the frequencies which reflect in-phase and contribute to standing waves may be given by:

$$f = n\frac{c}{2l}, n = 1, 2, 3 \ldots$$

for reflections to be incoherent (i.e., at least partially suppressed and/or canceled), and not lead to standing waves, one or more reflection points may cause half-wavelength reflection signals:

$$f = n\frac{c}{l},$$

that is, the length (l) may cause incoherent (i.e., at least partially suppressing and/or cancelling signals) for frequency f and harmonics. Discontinuities in geometry and/or material properties may reflect a fraction of the total energy (a partial reflection). Therefore, multiple reflection points may be configured on a filament for reflection elimination.

In particular, one or more reflection points may be configured on a filament at appropriate lengths to cause incoherent reflections at the desired frequency. For example, a reflection point may be spaced apart from an end of a filament by a length determined as described above such that the reflection signal caused by the reflection point and the reflection signal caused by the end of the filament arrive at a sensor out of phase for a given wavelength. With this in mind, a plurality of spaced apart reflection points may be configured on at least one filament such that reflection signals are incoherent for multiple frequencies of a desired frequency range. In general, reflection signals are incoherent if peak amplitude associated with each reflection signal is at least partially reduced. In some embodiments, reflection points may be configured such that the reflection signals are destructive with respect to each other such that the reflection signals are cancelled or significantly suppressed (i.e., the amplitudes are suppressed such that a sensor's detection thereof is negligible and/or distinct from a measurement signal).

Figure 13:
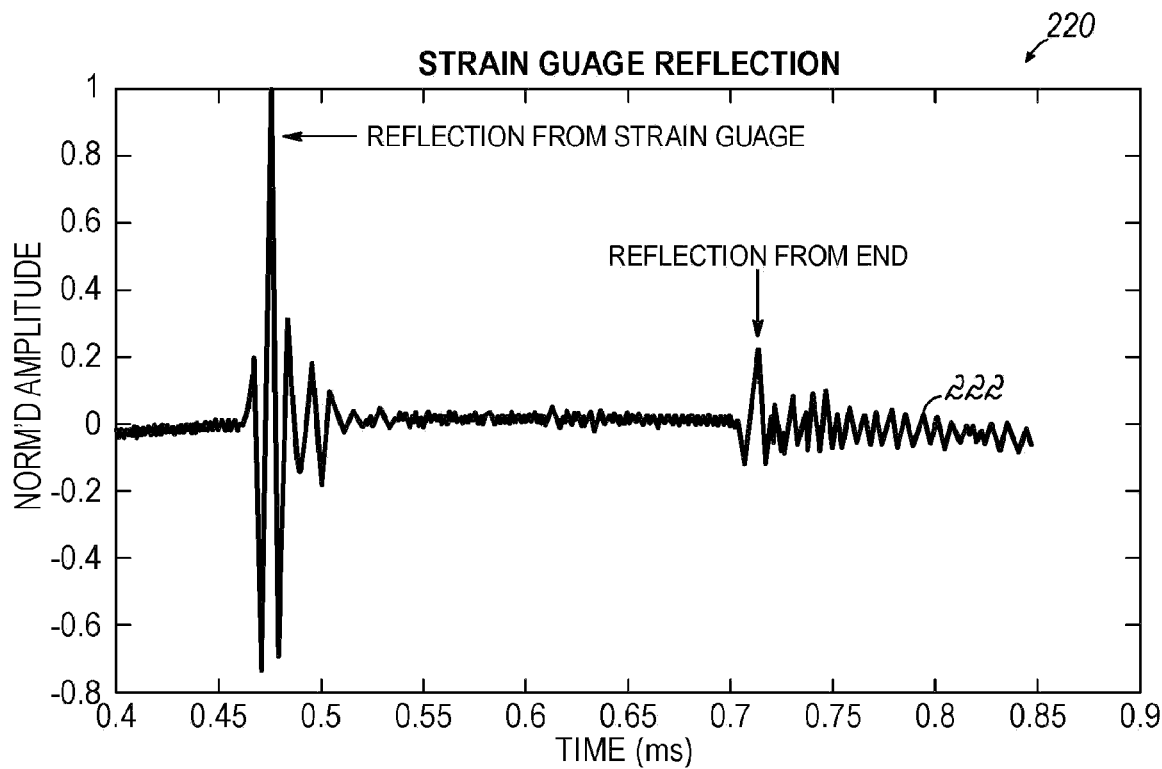
FIG. 13 is an example time domain response chart that illustrates example signal reflections for a filament of a waveguide of FIG. 1 or 2 including a sensor having a piezoelectric strain gauge.
Figure 14:
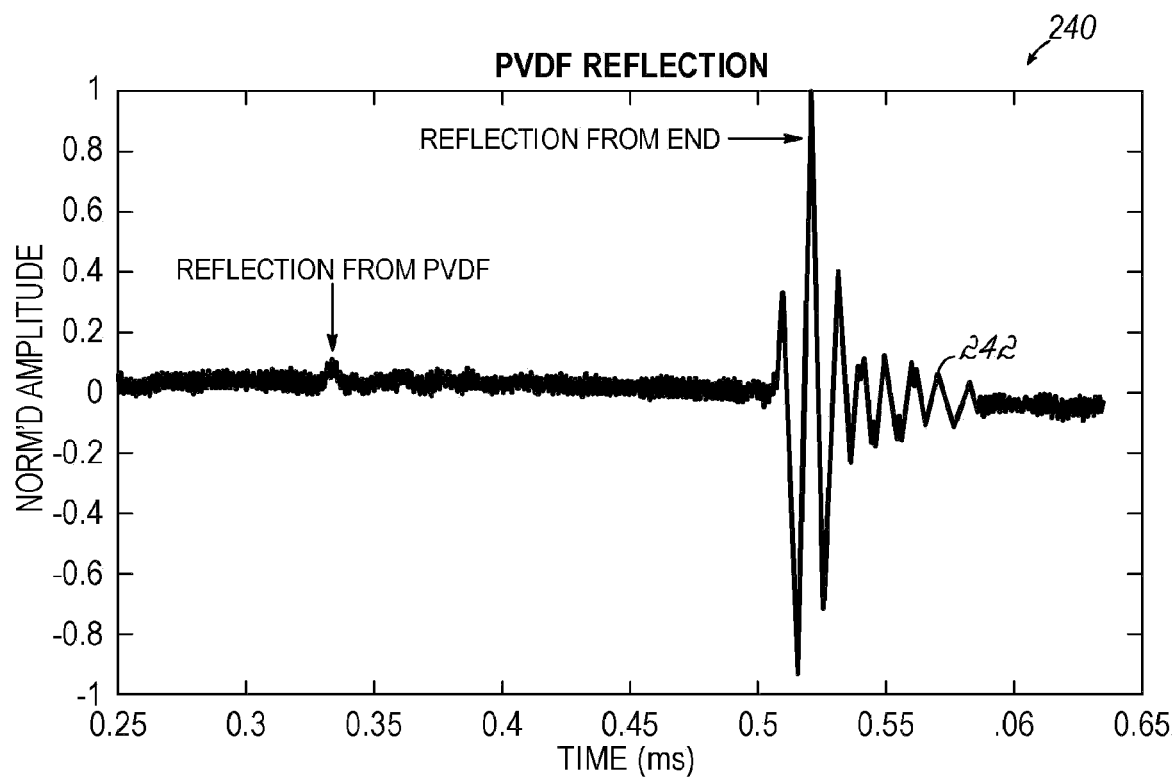
FIG. 14 is an example time domain response chart that illustrates example signal reflections for a filament of a waveguide of FIG. 1 or 2 including a sensor having a piezoelectric polymer film.

As described previously, a waveguide consistent with embodiments of the invention may comprise a sensor coupled to at least one filament. As described, a sensor may comprise a strain gauge including a piezoelectric device, and/or a piezoelectric polymer film, such as polyvinylidene fluoride (PVDF). In some embodiments, selection of a type of sensor to be coupled to at least one filament may be dependent upon the intended application. Referring to FIG. 13, this figure provides a time domain response chart 220 that includes an example trace 222 associated with reflection signals for a waveguide comprising a strain gauge sensor including a piezoelectric material. As illustrated, the strain gauge sensor may contribute to reflection signals, and in some cases may contribute to a reflection signal that has a higher amplitude than a reflection signal associated with an end of the filament. FIG. 14 provides a time domain response chart 240 that includes an example trace 242 associated with reflection signals for a waveguide comprising a PVDF strain gauge sensor. As illustrated in the example, a PVDF strain gauge sensor may not contribute significantly to reflection signals relative to a reflection signal caused by an end of a filament. In some embodiments, a sensor comprising a piezoelectric polymer film may be tangentially bonded to the circumference of at least one filament, which may reduce the amplitude of a reflection signal caused thereby.

Figure 15:
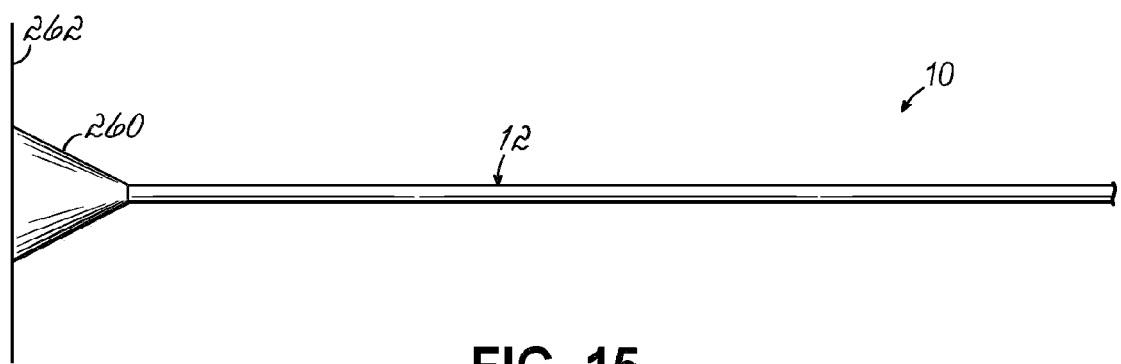
FIG. 15 is a block diagram of the waveguide of FIG. 1 coupled to an at least partially frustoconical securing element that secures at least one filament of the waveguide to a surface.

In some embodiments of the invention, a waveguide may comprise at least one filament coupled to a securing element that is configured to secure to a surface for which monitoring/measurement is desired. As shown in FIG. 15, a filament 12 of a waveguide 10 is coupled to a securing element 260 that is at least partially frustoconical, such that vibration energy from a desired measuring surface 262 may be transmitted through the securing element 260 to the at least one filament 12. In addition, the securing element 260 may comprise a blind threaded opening such that a stud may be coupled thereby to attach the securing element to the surface 262.

Figure 16:
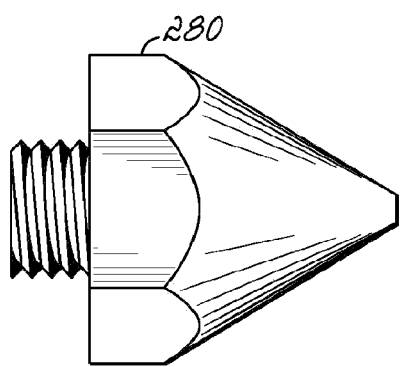
FIG. 16 is a front view of an at least partially frustoconical securing element that may be utilized as illustrated in FIG. 15.
Figure 17:
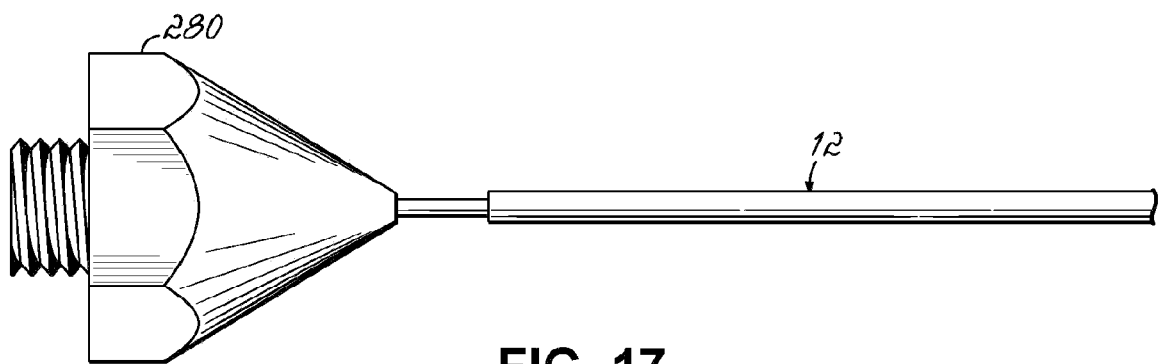
FIG. 17 provides an example illustration of a filament of the waveguide of FIG. 1 coupled to the frustoconical securing element of FIG. 16.
Figure 18:
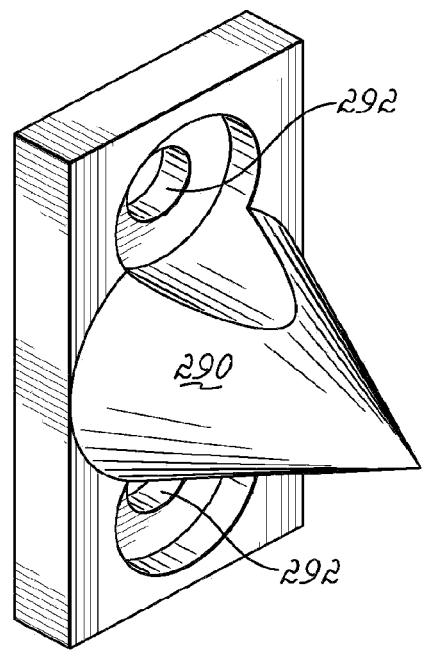
FIG. 18 is a perspective view of an at least partially frustoconical securing element that may be utilized as illustrated in FIG. 15.

FIG. 16 provides a front view of a securing element 280 consistent with some embodiments of the invention. FIG. 17 is an illustration of the securing element 280 of FIG. 16 coupled to a filament 12. FIG. 18 is an illustration of a securing element 290 that is configured with openings 292 through which fastening elements (e.g., screws, bolts, and/or other such fasteners) may be inserted to fasten the securing element 290 to a desired surface. Consistent with embodiments of the invention, a securing element may comprise various materials including, for example, lead, gold, tin, stainless steel, solder, brazing alloys and welding filler metals and/or other such materials. In general, a material of a securing element consistent with embodiments may include material properties that facilitate the transmission of energy therethrough and to a filament. Moreover, a securing element may be at least partially hemispherical, frustoconical, and/or other such shapes that may be secured to a desired surface and connected to a filament. For example, a securing element may be an at least partially hemispherical cone and/or other such shapes that may facilitate transmission of energy therethrough.

Figure 19:
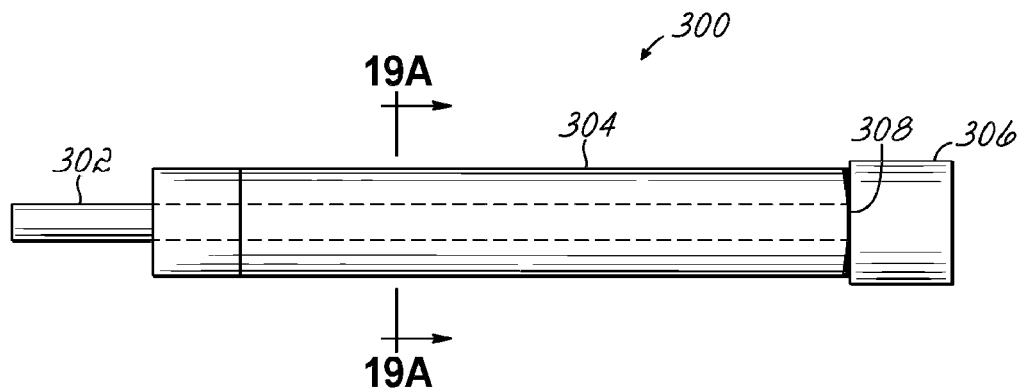
FIG. 19 is a side view of a waveguide consistent with some embodiments of the invention.
Figure 19A:
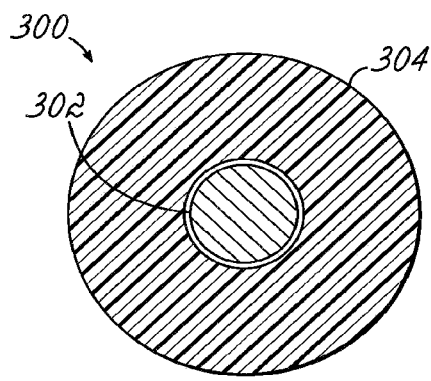
FIG. 19A is a cross-sectional view of the waveguide of FIG. 19.

FIG. 19 provides a side view of a waveguide 300 consistent with some embodiments of the invention. As shown, the waveguide 300 comprises at least one filament 302 and a cladding material 304. As shown, the cladding material 304 surrounds, encloses, covers, and/or encases at least a portion of the at least one filament 302 (where such surrounded portion is illustrated in dashed line). The at least one filament 302 is connected to a sensor 306 at a first end 308. Consistent with some embodiments of the invention, the surrounded portion of the filament 302 may loosely fit within the cladding material 304, where loosely fit is generally used to describe that the surrounded portion of the filament may be movable within the cladding material 304, and/or spaced apart from the cladding material 304. For example, the cladding material 304 may comprise a solid tube having an interior circumference greater than a relative exterior circumference of the at least one filament 302 such that the surrounded portion of the at least one filament is spaced apart from the solid tube. As shown, FIG. 19 includes a view line 19A that is shown in FIG. 19A. FIG. 19 provides a cross sectional view along the view line 19A of FIG. 19. As shown, the at least one filament 302 may be surrounded, encompassed, enclosed, and/or encased by the cladding material 304. In some embodiments, the cladding material 304 may be in contact with the at least one filament (e.g., closely fit), while in other embodiments, the cladding material 304 may be spaced apart from the at least one filament 302 (e.g., loosely fit). In some embodiments of the invention, the surrounded portion of the at least one filament may be hermetically sealed.

Figure 20:
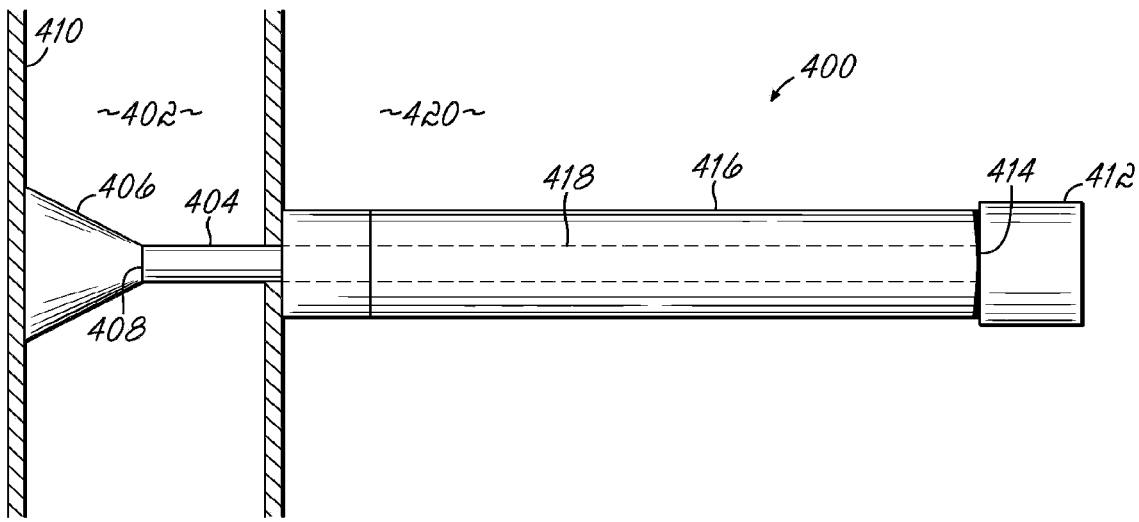
FIG. 20 is an example implementation of a waveguide consistent with some embodiments of the invention.

FIG. 20 provides a diagram that illustrates an example implementation of a waveguide 400 that may be positioned to sense environmental conditions of a sensing location 402. For example, the sensing location 402 may be a harsh environment, such as a high temperature environment, a high pressure environment, a high vibration environment, and/or other such types of sensing environments. In the example implementation illustrated in FIG. 20, the waveguide 400 comprises at least one filament 404 coupled to a securing element 406 at a first end 408 of the at least one filament 404, where the securing element is coupled to a surface 410 of the sensing location 402. In this example, the first end 408 of the at least one filament may be referred to as a measurement end. The at least one filament 404 is coupled to a sensor 412 at a second end 414 of the at least one filament 404. In general the sensor 412 may comprise a piezoelectric element. In this example, the second end 414 of the at least one filament may be referred to as a sensing end.

Furthermore, the waveguide 400 comprises a cladding material 416 encompassing a portion 418 of the at least one filament 404 (which is illustrated with dashed lines to illustrate the positioning of the portion 418 within the cladding material 416. In this particular embodiment, the cladding material 416 may provide a hermetic seal between the sensing location 402 and a second location 420, such as where the sensor 412 is located. Hence, the cladding material 416 and the hermetic seal provided thereby may prevent an exchange of environmental conditions between the sensing location 402 and the second location 420. For example, the hermetic seal may prevent the escape of gasses and/or pressure associated with the measurement end and/or sensing location. Therefore, in some embodiments, a waveguide may comprise at least one hermetically sealed end. In some embodiments, a waveguide may have two hermetically sealed ends. In addition, the second end 414 of the at least one filament 404 may be hermetically sealed to the sensor 412. As will be appreciated, in some embodiments a cladding material may be of various cross sectional shapes. For example, in some embodiments, the cladding material may comprise a solid tube that is radially and/or helically ridged.

While the present invention has been illustrated by a description of the various embodiments and the examples, and while these embodiments have been described in considerable detail, it is not the intention of the applicants to restrict or in any way limit the scope of the appended claims to such detail. Additional advantages and modifications will readily appear to those skilled in the art. For example, waveguide may include more or fewer filaments 12 than those shown and described. Moreover, filaments consistent with embodiments of the invention may be of various lengths and may have various cross-sectional geometries. Thus, the invention in its broader aspects is therefore not limited to the specific details and representative apparatuses shown and described. Accordingly, departures may be made from such details without departing from the spirit or scope of applicants' general inventive concept.

What is claimed is:

1. A broadband waveguide configured to communicate a stress wave, comprising:
   a filament including a first end, a second end, and a length between the first and second ends, the filament formed of a material that is transmissive of stress waves, the first end of the filament configured to be coupled to a structure that generates a stress wave indicative of vibration or pressure at the structure such that the stress wave is introduced proximate the first end of the filament for passive broadband measurement of the vibration or pressure proximate an intermediate location of the filament between the first and second ends; and
   a cladding material at least partially engaging the filament, wherein the first end is hermetically sealed by the cladding material;
   wherein the filament further includes at least one reflection point configured to at least partially reflect the stress wave as a first reflection signal, and the second end reflects the stress wave as a second reflection signal, and the first reflection signal and the second reflection signal are out of phase.

2. The broadband waveguide of claim 1, wherein the at least one reflection point is spaced apart from the second end of the filament such that the first reflection signal is out of phase with the second reflection signal.

3. The broadband waveguide of claim 2, wherein the length is based at least in part on a frequency and a material property of the filament corresponding to wave propagation velocity.

4. The broadband waveguide of claim 1, wherein the at least one reflection point is a reflection notch on the filament.

5. The broadband waveguide of claim 1, wherein the filament comprises a first material, and the at least one reflection point comprises a second material having different material properties than the first material.

6. The broadband waveguide of claim 1, further comprising a damping material at least partially engaging at least a portion of the filament having a defined length based at least in part on an application of the broadband waveguide.

7. The broadband waveguide of claim 6, wherein the defined length is greater than about 0.5 inches.

8. The broadband waveguide of claim 6, wherein the damping material comprises polyolefin shrink tubing.

9. The broadband waveguide of claim 6, wherein the damping material comprises a first layer having a first length and a second layer having a second length different than the first length.

10. The broadband waveguide of claim 6, wherein the second end reflects the stress wave as a reflected signal and the defined length of the damping material is configured to absorb at least a portion of energy associated with the reflected signal to thereby at least partially suppress the reflected signal.

11. The broadband waveguide of claim 1, further comprising a sensor connected to the filament and configured to sense the stress wave transmitted through the filament.

12. The broadband waveguide of claim 11, wherein the sensor comprises a piezoelectric element.

13. The broadband waveguide of claim 12, wherein the piezoelectric element includes poled piezoelectric material.

14. The broadband waveguide of claim 11, wherein the sensor comprises a piezoelectric polymer film and at least one metallization element positioned in the piezoelectric polymer film.

15. The broadband waveguide of claim 11, wherein the sensor is tangentially bonded to a circumference of a portion of the filament.

16. The broadband waveguide of claim 1, further comprising a securing element coupled to the first end of the filament and configured to couple to a surface.

17. The broadband waveguide of claim 16, wherein the securing element is at least partially frustoconical.

18. The broadband waveguide of claim 16, wherein the securing element is at least partially hemispherical.

* * * * *